(12) United States Patent
Shimizu et al.

(10) Patent No.: US 6,503,685 B1
(45) Date of Patent: Jan. 7, 2003

(54) HEAT SENSITIVE COMPOSITION, ORIGINAL PLATE USING THE SAME FOR LITHOGRAPHIC PRINTING PLATE, AND PROCESS FOR PREPARING PRINTING PLATE

(75) Inventors: Shinji Shimizu, Tatebayashi (JP); Yasuyuki Watanabe, Chiba (JP); Yasuhiko Kojima, Konosu (JP); Koji Oe, Kitamoto (JP); Nansei Tasiro, Sodegaura (JP)

(73) Assignee: Dianippon Ink and Chemicals, Inc., Tokyo (JP)

( * ) Notice: Subject to any disclaimer, the term of this patent is extended or adjusted under 35 U.S.C. 154(b) by 57 days.

(21) Appl. No.: 09/711,082

(22) Filed: Nov. 14, 2000

Related U.S. Application Data

(62) Division of application No. 09/271,369, filed on Mar. 18, 1999.

(30) Foreign Application Priority Data

Mar. 20, 1998 (JP) ............................................ 10-071825

(51) Int. Cl.$^7$ ............................. G03C 1/73; G03C 1/76; G03F 9/00; G03F 7/039; G03F 7/30
(52) U.S. Cl. ................................ 430/270.1; 430/273.1; 430/5; 430/302; 430/306; 430/325; 430/326
(58) Field of Search .................... 430/270.1, 5, 273.1, 430/302, 306, 325, 326, 905, 910

(56) References Cited

U.S. PATENT DOCUMENTS

| 4,900,774 A | 2/1990 | Mitsuji et al. ............... 524/512 |
| 5,759,736 A | 6/1998 | Nishi et al. .................. 430/190 |
| 5,952,429 A | 9/1999 | Ikeda et al. ............... 525/326.1 |

FOREIGN PATENT DOCUMENTS

| EP | 0 514 145 A1 | 11/1992 |
| EP | 0 523 992 A1 | 1/1993 |
| EP | 0 774 364 A1 | 5/1997 |
| EP | 0 816 920 A2 | 1/1998 |
| JP | 50-113307 | 9/1975 |
| JP | 5-66600 | 3/1993 |
| JP | 5-265247 | 10/1993 |

*Primary Examiner*—Janet Baxter
*Assistant Examiner*—Sin J. Lee
(74) *Attorney, Agent, or Firm*—Armstrong, Westerman & Hattori, LLP

(57) ABSTRACT

A heat-sensitive composition is disclosed which includes a substance which absorbs light and generates heat, an anionic self water-dispersible resin particle having an acid value of 10 to 300 and an average particle diameter of 0.005 to 15 µm, and a fluorine base surfactant. An original plate for a lithographic printing plate is disclosed which includes an ordinary negative- or positive-type PS plate having coated thereon the heat-sensitive composition. The original plate is image-wise exposed with high energy density light based on digital image information from a computer, subjected to first development with an aqueous alkali solution, flood exposure with active light, a second development with a developer for a negative or a positive, and post-treatment to obtain a printing plate.

7 Claims, No Drawings

HEAT SENSITIVE COMPOSITION, ORIGINAL PLATE USING THE SAME FOR LITHOGRAPHIC PRINTING PLATE, AND PROCESS FOR PREPARING PRINTING PLATE

This application is a divisional of prior application Ser. No. 09/271,369, filed Mar. 18, 1999.

BACKGROUND OF THE INVENTION

1. Field of the Invention

The present invention relates to a lithographic printing plate used in the field of offset printing, and more particularly to a positive- or negative-type original plate for a lithographic printing plate which is used as a so-called computer-to-plate (CTP) plate that is applicable to direct plate making based on digital signals from a computer or the like.

This application is based on Patent Application No. Hei 10-71825 filed in Japan, the content of which is incorporated herein by reference.

2. Description of Related Art

As systems for direct plate making based on digital signals from a computer, there have hitherto been known (1) a system which uses electrophotography, (2) a system which uses Ar laser exposure and post-heating, (3) a system which uses high power laser exposure and post-heating, (4) a system which uses diffusion transfer of a silver salt, (5) a system which ablates a silicone rubber layer by electric discharge or irradiation with a laser beam, (6) a system which forms a mask layer on a conventional lithographic presensitized plate (PS plate) having a light-sensitive image forming layer, forms an image on the mask layer, performs flood exposure, develops, and performs post-treatment to obtain a printing plate, and the like. At present, these have their own merits and demerits, and further investigation is currently under way. Of the above-described systems, particularly the plate material obtained by the technology described in (6) above provides a high resolution image, is adaptable to a large size plate, and provides a printing plate, which is a final product, which is similar to conventional ones, so that printing operators are accustomed thereto through their experience. For this reason or for other reasons, the system has been regarded as a technology replacement system which can be easily accepted by operators at actual operating sites when replacing a conventional plate making system using a film and a PS plate by a computer-to-plate (CTP) plate making system.

As methods for forming a mask image on a conventional PS plate, there have been known i) an inscribing method performed by an ink jet, ii) a thermal transfer method, iii) a method which includes coating a silver salt layer on a PS plate, image-wise exposing the silver salt layer, and developing by a wet method to obtain a mask image, iv) a method which includes ablation of the mask layer provided on a PS plate with a high power laser beam to form an image, and the like.

Of these, the methods i) and ii) have problems that they do not provide high resolution, or the inscribing speed is low, while the method iii) gives high resolution but involves complicated post-treatment or other problems.

The method using ablation with laser beam is a known technology as described in Japanese Patent Unexamined Publications Nos. 50-113307, 50-102401, 50-158405, 53-23705, 53-33702, 58-18290, 60-83893, 61-36750, etc. It has various practical problems. That is, high resolution is difficult to obtain because of non-uniform ablation traces, there is the concern of contamination of appliances due to scattering or evaporation at the time of inscribing, inscribing on a large plate takes a long time because it requires a high energy of usually 800 to 1,200 mJ/cm$^2$, which makes the inscribing speed very slow, and the like. Also, when images are formed using high energy density light, usually a problem called banding occurs. Banding is a phenomenon which is observed as a band-like pattern, caused by a fluctuation in the output power of a laser device used as an optical source or by a difference in light intensity distribution in an incident plane appearing near the boundary between scanning lines when linear scanning is operated. This phenomenon is observed frequently in the case of directly inscribing on a printing material using a high energy density laser.

BRIEF SUMMARY OF THE INVENTION

The present invention has been made with a view to obviating the above-described problems and a first object of the present invention is to provide positive- and negative-type original plates for lithographic printing plates which are amenable to high speed image inscription at a very low optical energy exposure, as low as 150 to 200 mJ/cm$^2$, which enables clean treatment and which enables direct inscription thereon with high energy density light.

A second object of the present invention is to provide an original plate for a lithographic printing plate which is free of problems such as banding and the like and provides a high quality printing plate image by relaxation and rendering uniform homogenization over the flood exposure step after the formation of a mask.

A third object of the present invention is to provide an original plate for a lithographic printing plate which can give a final printing plate which is equivalent to a conventional printing plate (PS plate) so that when printing, skilled printing operators can give full play to their experience in working in actual printing sites and which they can handle without a feeling of unfamiliarity.

A fourth object of the present invention is to provide an original plate for a lithographic printing plate, which is a high energy density light inscribable computer-to-plate printing plate which is applied to direct plate making based on digital signals from a computer or the like and which allows the use of a conventional treating apparatus upon development treatment and a conventional printer as it is upon printing.

A fifth object of the present invention is to provide an original plate for a lithographic printing plate having an improved workability which can be operated under ordinary room light or the like without requiring a special safety light, but with which prepares a good printing plate can be prepared.

A sixth object of the present invention is to provide a heat-sensitive composition comprising as an essential component an anionic self water-dispersible resin particle, the composition efficiently absorbing high energy density light and converting it to thermal energy and as a result giving rise to a sharp high resolution latent image.

A seventh object of the present invention is to provide an easy, inexpensive treating method which treats a latent image formed in a heat-sensitive composition layer with an alkaline aqueous solution to form a sharp mask image and such that upon the development treatment of light-sensitive image forming layer as a post-treatment, the mask image layer as well as a non-image portion of the light-sensitive image forming layer can be removed.

An eighth object of the present invention is to provide a process for preparing a printing plate which uses the positive- or negative-type original plate for a lithographic printing plate of the present invention which has attained the above-described objects and with which a good printing plate having the high resolution required for printing can be prepared.

The present invention has been completed based on the finding of a novel process which uses, as a mechanism for forming an inscribed image on a light-sensitive composition layer with high energy density light, formation of a latent image by mutual melting and fusion of resin particles in the image portion due to the heat generated by absorption of light energy and subsequent development of the latent image by removal of the non-modified, non-image portion by a wet method using a treatment liquor, as opposed to a mechanism utilizing chemical reaction such as polymerization reaction on a so-called negative PS plate or the like involving light energy and a monomer or modification accompanying partial decomposition reaction of a polymer with light energy (positive type PS plate). The image forming step for the mask layer according to the present invention is of a mechanism which utilizes physical changes of a substance but is based on a principle quite different from the conventional technology.

That is, in order to achieve the above-described objects, a first aspect of the present invention is a heat-sensitive composition comprising a substance which absorbs light and generates heat, an anionic self water-dispersible resin particle having an acid value of 10 to 300 and an average particle diameter of 0.005 to 15 µm, and a fluorine base surfactant.

A second aspect of the present invention is an original plate for a lithographic printing plate comprising a known support having a hydrophilic surface, a negative- or positive-type light-sensitive image forming layer coated on the support, and the heat-sensitive composition layer described above.

A third aspect of the present invention is-a process for preparing a lithographic printing plate comprising the steps of:

(1) image-wise exposure to high energy density light;
(2) removing the non-imaged portion by a wet process to form a mask image (hereafter, referred to as "first development");
(3) flood exposure to active light of the negative- or positive-type light-sensitive image forming layer to form a latent image based on the mask image;
(4) developing the resulting negative-type light-sensitive image forming layer with a developer for a negative to form an image on a printing plate (hereafter, referred to as "second development"); or developing the resulting positive-type light-sensitive image forming layer with a developer for a positive to form an image on a printing plate (also referred to as "second development"); and
(5) washing, gumming, and drying.

As described above, the original plate for a lithographic printing plate of the present invention including a usual negative- or positive-type PS plate having coated thereon a heat-sensitive composition containing a substance which absorbs light and generates heat, an anionic self water-dispersible resin particle having an acid value of 10 to 300 and an average particle diameter of 0.005 to 15 µm, and a fluorine base surfactant can provide a printing plate having substantially the same printing characteristics as a printing plate prepared from a conventional PS plate by image-wise exposure with high energy density light based on digital information from a computer, a first development with an aqueous alkali solution, flood exposure with active light, a second development with a developer for a negative or positive, post-treatments, etc.

DETAILED DESCRIPTION OF THE INVENTION

The present invention is featured by having a heat-sensitive composition layer having a very high sensitivity to high energy density light formed on a light-sensitive image forming layer of an ordinary PS plate. Hereafter, the heat-sensitive composition layer of the present invention will be described in detail.

In the present invention, it is essential that the heat-sensitive composition layer contain a substance which absorbs light and generates heat. As such a substance, various pigments can be used.

At the same time, the pigment used must sufficiently shield active light during flood exposure to active light during the processing steps to exhibit a masking effect for the underlying light-sensitive image forming layer.

As the pigment which can be used in the present invention, there can be used commercially available pigments and those pigments described in the Color Index Manual "Saishin Ganryou Binran" (Latest Pigment Manual) (edited by the Japan Pigment Technology Association, 1977), "Saishin Ganryou Ouyou Gijutsu" (Latest Pigment Applied Technology) (CMC Publishing, 1986), "Insatsu Inki Gijutsu" (Printing Ink Technology) (CMC Publishing, 1984), etc. The types of pigment include black pigments, yellow pigments, orange pigments, brown pigments, red pigments, violet pigments, blue pigments, green pigments, fluorescent pigments, and in addition, polymer bound coloring pigments. More specifically, there can be used insoluble azo pigments, azo lake pigments, condensed azo pigments, chelate azo pigments, phthalocyanine base pigments, anthraquinone base pigments, perylene and perinone base pigments, thioindigo base pigments, quinacridone base pigments, dioxazine base pigments, isoindolinone base pigments, quinophthalone base pigments, dye lake pigments, azine pigments, nitroso pigments, nitro pigments, natural pigments, fluorescent pigments, inorganic pigments, carbon black, etc. Among these specific examples, carbon black is particularly preferred as a substance which absorbs a near infrared to infrared ray laser beam to efficiently generate heat, effectively shields active light, and is economically competitive.

These pigments may be used without surface treatment or may be subjected to a known surface treatment. As the known surface treating method, there can be used a method including surface-coating a resin or wax, a method which attaches a surfactant, a method in which a reactive substance (for example, a silane coupling agent or an epoxy compound, polyisocyanate, etc.) is bound to the surface of a pigment, and so on. These surface treating methods are described in "Kinzoku Sekken no Seishitsu to Ouyou" (Properties of Metal Soaps and Their Application) (Saiwai Shobo), "Saishin Ganryou Ouyou Gijutsu" (Latest Pigment Applied Technology) (CMC Publishing, 1986), and "Insatsu Inki Gijutsu" (Printing Ink Technology) (CMC Publishing, 1984). In particular, what is preferably used in the heat-sensitive composition layer of the present invention is grafted carbon black which has a dispersibility in a dispersant improved by graft polymerization.

The grafted carbon black used in the present invention can be prepared by a method which involves polymerization of a vinyl monomer using a polymerization initiator in the presence of carbon black and collecting a growing polymer chain on the surface of the particles, a method which grows a graft chain from a polymerization initiating group introduced onto the surface of carbon black, a method which involves reaction between a functional group on the surface of carbon black with a reactive polymer, or the like. At present, grafted carbon blacks having various functional groups and having excellent dispersibility are commercially available and these can be used in the present invention. These grafted carbon blacks are described in detail in "Carbon Black Manual, 3rd edition, (edited by the Carbon Black Association) 1995, p.167", "Characteristics of Carbon Black and Optimal Formulation and Applied Technology (Technical Information Association) 1997, p. 111", etc. Any of them can be advantageously used in the present invention.

Specific examples of grafted carbon black include those obtained by grafting unsaturated polyester to carbon black, followed by radical polymerization with various vinyl monomers, radical polymerization products between CB-peroxide group obtained by reaction of carbon black with lauroyl peroxide and various vinyl monomers, radical polymerization products between carbon black having introduced thereto an azo group and various vinyl monomers, cation ring-opening polymerization products between acylium perchlorate and vinyl monomer, lactone, cyclic ether, cyclic acetal, or the like, cation ring-opening isomerization polymerization product between a chloromethyl group introduced onto carbon black and a 2-oxazoline, cation graft polymerization products between benzylium perchlorate introduced onto carbon black and a vinyl monomer, lactone, and a cyclic ether, etc., anion ring-opening polymerization products between a potassium carboxylate group introduced onto carbon black and β-propionolactone, anion ring-opening alternating copolymerization among a potassium carboxylate group introduced onto carbon black and an epoxide and a cyclic acid anhydride, anion graft polymerization products between carbon black/butyl lithium complex and methyl methacrylate or acrylonitrile, ring-opening polymerization products between an amino group introduced onto carbon black and α-amino acid N-carboxylic anhydride, graft polymerization products among a highly reactive functional group, for example, an isocyanate group, an acyl azide group, an acyl chloride group, an epoxy group, a chlorotriazinyl group, or an active ester group, a polypropylene glycol, polyethylene glycol, silicone diol, silicone diamine, or polyethyleneimine, or the like.

In particular, among these graft-polymerized carbon blacks, those which are suitably dispersible in a coating liquid which is necessary for forming a heat-sensitive composition layer as mixed with resin particles having an acid value of 10 to 300 are grafted carbon black containing an anionic group in the graft polymerization product. As such an anionic group, there can be cited, for example, a phosphoric acid group, a sulfonic acid group, a sulfuric acid group, a carboxyl group, with a carboxyl group being particularly preferred. The method for introducing such a carboxyl group, which is preferred as an anionic group, to a graft resin for the carbon black will be described.

Vinyl base graft polymerization products having a carboxyl group can be prepared easily by graft polymerizing a polymerizable monomer composition containing a polymerizable monomer having a carboxyl group or grafting to carbon black a polymer obtained by preliminarily copolymerizing a polymerizable monomer composition containing a polymerizable monomer having a carboxyl group. The polymerizable monomer having a carboxyl group include, for example, acrylic acid, methacrylic acid, crotonic acid, fumaric acid, itaconic acid, maleic acid, monoalkyl maleates such as monobutyl maleate, monoalkyl itaconates such as monobutyl itaconate, etc.

In addition, carboxyl groups can also be introduced by a method in which a monoalcohol such as butyl alcohol is added to an acid anhydride group-containing graft polymer, a compound containing an acid anhydride group such as maleic anhydride, phthalic anhydride, or trimellitic anhydride is added to a vinyl base graft polymer containing a hydroxyl group obtained by graft polymerizing a polymerizable monomer having a hydroxyl group, or the like.

The polyester resin having a carboxyl group can be prepared by selecting a compound having a carboxylic group such as a monobasic acid, a dibasic acid, a tribasic or higher polybasic acid and a compound having a hydroxyl group such as a diol, a polyol or the like and dehydrocondensing them by a known method such as a melting method, a solvent method or the like such that carboxyl groups can remain. The carboxyl groups are mainly unreacted carboxyl groups derived from the dibasic acid or polybasic acid which constitutes the polyester resin. Grafting the resulting polyester resin to the reactive group of carbon black results in carbon black having grafted thereto a polyester resin having a carboxyl group.

Other methods for introducing a carboxyl group into a polyester resin include a method in which a compound having an acid anhydride group such as maleic anhydride, phthalic anhydride, or trimellitic anhydride is added to a linear or branched polyester resin having a hydroxyl group, a method for introducing a carboxyl group and simultaneously extending the chain in which a tetracarboxylic dianhydride such as pyromellitic anhydride is reacted with a polyester resin, preferably a linear polyester resin, having a hydroxyl group.

Further, a carboxyl group can be introduced by further graft polymerizing, to a carbon black grafted with a polyester resin, a polymerizable monomer composition containing a polymerizable monomer having a carboxyl group.

Carbon black grafted with a polyurethane resin having a carboxyl group can be prepared with ease by reacting a polyol component containing a compound having both a carboxyl group and a hydroxyl group such as dimethylolpropionic acid as a component for introducing a carboxyl group with a polyisocyanate component.

The pigment used in the present invention preferably has a particle diameter within the ranges of 0.01 to 15 $\mu$m, more apreferably 0.05 to 5 $\mu$m.

The amount of pigment to be used is 1 to 70% by weight, preferably 10 to 50% by weight, based on the total solids in the heat-sensitive composition layer. If the addition amount is less than 1% by weight, then when light is absorbed to generate heat, the heat generated is insufficient for melting the coexisting resin but if the addition amount is more than 70% by weight, then too much heat is generated and phenomena such as burning and destruction will occur so that it is difficult to form a melt latent image suitable for forming images.

The anionic self water-dispersible resin particle having an acid value of 10 to 300 and an average particle diameter of 0.005 to 15 $\mu$m, which is an essential component constituting the heat-sensitive composition layer of the present invention, will be described hereinbelow.

In the present invention, the resin material in the heat-sensitive composition layer has the following roles. Firstly, the pigment irradiated with high energy density light converts photo energy to thermal energy and the resin particles are thermally melted and/or fused by the generated heat and denatured so that for example, adhesion with the underlying light-sensitive image forming layer changes greatly or upon removal of light-sensitive composition layer by a wet method (first development), solubility in an alkaline aqueous solution greatly decreases due to the thermal denaturation of resin particles. In this case, the resin particles themselves do not have to alter their properties due to thermal denaturation but it is sufficient that the resin particles subjected to thermal denaturation wrap around the dispersed pigment and the resulting heat-sensitive composition layer is thermally denatured. In order to conduct the thermal denaturation efficiently, the average particle size of the resin particle has to be within the ranges of 0.005 to 15 μm. A particle size larger than 15 μm is insufficient for the resin particles which receive the generated heat to melt and fuse while a particle size less than 0.005 μm is substantially uneconomical when put in practice. The original plate for a lithographic printing plate of the present invention is used for image processing so that there occurs another problem, that use of resin particles having too large a particle size, i.e., particles having a particle size larger than 15 μm, decreases the resolution in image processing. With respect to the particle size distribution of resin particles, a narrower particle size distribution is preferred since it gives rise to a sharper distribution of thermal fusion reaction due to heat absorption effect, resulting in an increased resolution of the resulting thermal image.

On the other hand, the non-image portion of heat-sensitive composition layer has to be removed sufficiently with an alkalinity such that the alkaline aqueous solution used during the first development treatment does not corrode the underlying negative- or positive-type PS plate. To efficiently remove the non-image portion during the first development, it is preferred that the resin particles have an anionic group which is soluble in an alkaline aqueous solution. The anionic group includes a carboxylic group, a phosphoric acid group, a sulfonic acid group, a sulfuric acid group, etc. A carboxylic group is used particularly preferably. The amount of a carboxylic group necessary in the resin particle may be expressed in terms of a value of KOH mg necessary for neutralizing 1 g of a resin; the resin particles used in the present invention must have an acid value of 10 to 300. If the acid value is less than 10, the dissolution and development by the first development is insufficient while an acid value above 300 will cause inconveniences such as an increase in the viscosity when coating, a decrease in storage stability during the storage of original plate for printing plate, and so on.

Therefore, the characteristics required for the resin particles in the heat-sensitive composition layer are uniform dispersion in the coating solution together with a pigment component, formation of a stable coating film after drying, and exhibition of the above-described effect upon thermal denaturation and as the resin particles having such characteristics can be cited the resin particles having an acid value of 10 to 300 and an average particle diameter of 0.005 to 15 μm.

Further, in the process of the production of an original plate for a lithographic printing plate in the present invention, a coating solution for a heat-sensitive composition layer is coated on a negative- or positive-type PS plate and subsequently dried in a drying step. It is desirable that the coating solution is efficiently and practically dried in the drying step without causing thermal denaturation such as melting, etc. For this purpose, it is preferred that the resin particles of the present invention have a glass transition temperature of not lower than 50° C. At a temperature below 50° C., drying without thermal denaturation of the resin particles is possible but in this case, drying efficiency is poor and not practical.

Next, a method for obtaining resin particles used in the heat-sensitive composition layer of the present invention will be described. As the method for producing fine resin particles, there have hitherto been known a pulverization method, a suspension polymerization method, an emulsion polymerization and a reverse phase emulsion method. The pulverization method is unsuitable for the method for producing fine resin particles used in the heat-sensitive composition layer of the present invention since much pulverization is necessary for producing fine resin particles, and it is practically difficult to obtain fine particles having a particle diameter of not larger than 1 μm with a good accuracy, the resulting fine particles do not have a definite shape, so that they are disadvantageous in mixing/dispersion. The suspension polymerization method is unsuitable since it is also difficult in practice to obtain fine particles having a particle diameter of not larger than 1 μm, the suspension stabilizer used in the suspension polymerization remains on the surface of particle and is difficult to remove, it adversely affects the heat-sensitivity when added to the heat-sensitive composition layer, the particles will cause cissing when coated on a PS plate, and so on. The emulsion polymerization method is not preferred since although it is acceptable as a method for preparing fine resin particles of the present invention so far as the particle size is concerned, it is difficult, however, to remove the emulsification stabilizer present on the surface of the resulting resin particles and when they are added to the heat-sensitive composition layer, they adversely affect the heat sensitivity and cause cissing when coated on a PS plate, and so on.

On the other hand, the reverse phase emulsification method is a method for forming fine particles using so-called self water-dispersible resins having a dispersibility such that they disperse by themselves to such an extent that the average particle diameter is several μm or less, by the effect of an aqueous medium when producing fine resin particles comprising a water-insoluble liquid and/or a solid substance, i.e., a method which carries out emulsification and phase reversal of emulsion substantially simultaneously, as described in Japanese Patent Unexamined Publications Nos. 3-221137 and 5-66600. The reverse phase emulsification method can give rise to fine particles without requiring a special dispersion stabilizer or special appliance and has the feature that it can produce fine resin particles comprising as a major component a polyester resin, which is difficult to produce by a suspension polymerization method or emulsion polymerization and is most excellent as a method for producing fine resin particles used in the heat-sensitive composition layer of the present invention.

That is, the present invention provides among others, anionic self water-dispersible resin particles having an acid value of 10 to 300 and an average particle diameter of 0.005 to 15 μm which can be used suitably in the heat-sensitive composition layer of the present invention and also provides a method for producing the particles, comprising a first step in which an anionic self water-dispersible resin is dissolved or dispersed in an organic solvent, a second step in which the dissolved or dispersed composition is subjected to phase reversal of the emulsion to generate fine particles in an aqueous medium, and a third step in which optionally, the organic solvent and excess water are removed.

In the anion-type self water-dispersible resin of the present invention, the acid group which serves as a hydrophilic group has been introduced into the resin through a chemical bond and when neutralized with an organic base or an inorganic base, the acid group is converted into an anion in an aqueous medium to exhibit hydrophilicity. Specific examples of the acid group include a carboxylic group, a phosphoric acid group, a sulfonic acid group, or a sulfuric acid group. After neutralizing an organic continuous phase (O phase) comprising a solution of a resin having such an acid group in an organic solvent by addition of a base, incorporation of an aqueous medium (W phase) causes phase conversion (so-called phase reversal of emulsion) from W/O to O/W, to convert to a discontinuous phase, so that the resin is dispersed in the aqueous medium in the form of fine particles to form a stabilized dispersion.

Therefore, in the present invention, the anion-type self water-dispersible resin serves as the fine resin particles which constitute the heat-sensitive composition layer. As the anion-type self water-dispersible resin used in the present invention can be cited a polymerization product obtained by polymerizing a polymerizable monomer having an acid group with a polymerizable monomer other than the polymerizable monomer having an acid group in the presence of a polymerization initiator. Specific examples of the acid group-containing polymerizable monomer include, for example, acrylic acid, methacrylic acid, crotonic acid, itaconic acid, maleic acid, fumaric acid, monobutyl itaconate, monobutyl maleate, acid phosphooxyethyl methacrylate, acid phosphooxypropyl methacrylate, 3-chloro-2-acrylamide-2-methylpropanesulfonate, 2-sulfoethyl methacrylate, etc.

As the polymerizable monomers other than the acid group-containing polymerizable monomers include, for example, styrene base monomers (aromatic vinyl monomers) such as styrene, vinyltoluene, 2-methylstyrene, t-butylstyrene and chlorostyrene, various acrylic esters such as methyl acrylate, ethyl acrylate, isopropyl acrylate, n-butyl acrylate, isobutyl acrylate, n-octyl acrylate, decyl acrylate, and dodecyl acrylate, various methacrylic esters such as methyl methacrylate, ethyl methacrylate, isopropyl methacrylate, n-butyl methacrylate, isobutyl methacrylate, n-butyl methacrylate, isobutyl methacrylate, n-amyl methacrylate, isoamyl methacrylate, n-hexyl methacrylate, 2-ethylhexyl methacrylate, n-octyl methacrylate, decyl methacrylate, and dodecyl acrylate, various hydroxyl group-containing monomers such as hydroxyethyl acrylate or hydroxypropyl methacrylate, N-substituted acrylic monomers such as N-methyl(meth)acrylamide, N-butoxy(meth)acrylamide.

The copolymers derived from combinations of the above-described monomers may if desired be copolymers of a polymerizable monomer and a polymerizable unsaturated group-containing oligomer. Further, such a polymerizable unsaturated group-containing oligomer having an acid group may be used. Such a polymerizable unsaturated group-containing oligomer includes, for example, a vinyl-modified polyester, a vinyl-modified polyurethane, or a vinyl-modified epoxy compound, etc. As a specific example, a polymerizable unsaturated bond (a vinyl group) can be introduced by polycondensation or addition of various compounds such as maleic anhydride, fumaric acid, tetrahydrophthalic anhydride, endomethylene tetrahydromaleic anhydride, α-terpinene maleic anhydride adduct, a monoalkyl ether of triol, pentaerythritol diallyl ether, or allyl glycidyl ether, etc.

Further, to incorporate an acid group into a polyester, a dibasic acid such as phthalic acid can be used in excess, thereby obtaining a polyester having a terminal carboxyl group. Alternatively, a polyester having an acid group in the main chain thereof by use of trimellitic anhydride.

Also, the vinyl-modified polyurethane as described above can be obtained by addition polymerization of various polyol such as glycerol monoallyl ether or 1,2-bond-containing butadiene polyol with diisocyanate. Alternatively, a vinyl bond can be introduced by addition reaction between urethane having an isocyanate group at its terminal and a hydroxyl group-containing polymerizable monomer. Also, an acid component can be introduced into polyurethane by addition of dimethylolpropionic acid as a polyol component.

As the monomethacrylate of polyethylene glycol, there can be cited, for example, those having an average molecular weight of polyoxyethylene chain within the ranges of 1,000 to 4,000.

As the vinyl modified epoxy compound, for example, there can be cited those reacting terminal epoxy radicals of epoxy resin with carboxylic radicals of acrylic acid or methacrylic acid. Further, an oligomer of a polymerizable monomer having a polymerizable vinyl group can be obtained by addition of a glycidyl group-containing polymerizable monomer to a carboxyl group-containing vinyl copolymer. The polymerizable monomers used herein may be selected from among those described above.

In addition, there can be used terminal vinyl group-modified oligomers commercially available as a macromonomer, for example, manufactured by Toa Gosei Kagaku Kogyo. Needless to say, there is no limitation on the type or method so far as oligomers having a vinyl group are used.

Polymerization for obtaining these copolymers is carried out usually under an anaerobic atmosphere using a polymerization initiator. As the polymerization initiator, commonly known ones may be used, specific examples of which include various peroxides such as benzoyl peroxide, di-t-butyl peroxide, cumene hydroperoxide, t-butyl peroxide, and t-butyl peroxy-2-ethylhexanoate, and various azo compounds such as azobisisobutyronitrile and azobisisovaleronitrile.

As the reaction solvent, there can be used various organic solvents, for example, aromatic hydrocarbons such as toluene, xylene and benzene; various alcohols such as methanol, ethanol, propanol, and butanol; various ether alcohols such as cellosolve and carbitol; various ketones such as methyl ethyl ketone and methyl isobutyl ketone; various esters such as ethyl acetate and butyl acetate; various ether esters such as butyl cellosolve acetate, and so on.

Preferably, phase transition occurs with ease in the second step described hereinbelow and it is appropriate to use, in the third step, a so-called low-boiling organic solvent such as acetone, methyl ethyl ketone or ethyl acetate which can be readily desolvated.

The polymerization is carried out under the conditions of usually 50 to 150° C. in a nitrogen atmosphere, but they are not limited thereto. The proper amount of acid groups in the resulting copolymer is 10 to 300, preferably 15 to 200, and more preferably 20 to 150, in terms of acid value.

In view of the necessity of retaining sufficient hardness as fine resin particles, the acid group-containing copolymer is preferably one having a molecular weight larger than a certain level, usually a number average molecular weight within the ranges of 3,000 to 100,000, preferably 5,000 to 50,000. With a molecular weight of less than 3,000, the particle is low in strength so that the heat-sensitive composition layer has insufficient physical strength while with a molecular weight larger than 100,000, the viscosity at the time of phase reversal of emulsion becomes high, resulting in a difficulty in controlling the particle diameter and broader particle diameter distribution. Either case is undesirable.

To prevent fusion upon drying or blocking under high temperature atmospheres, it is appropriate for the anion-type self water-dispersible resin to have a glass transition temperature of 50° C. or higher.

In addition to the resins described above, the anion-type self water-dispersible resins used in the present invention include urethane resins, for example, urethane resin dispersion described in Japanese Patent Publication No. 1-287183, epoxy resins, for example, various epoxy compounds described as described in Japanese Patent Unexamined Publications Nos. 53-1228, 55-03481 or 55-9433.

In the preparation of the anion-type self water-dispersible resin of the present invention, the first step is to dissolve or disperse the above-described anion-type self water-dispersible resin in an organic solvent. For this method, a usual stirring apparatus can be used. If desired, the mixture can be heated or warmed to accelerate dissolution or dispersion.

The second step is a step in which after the anion-type self water-dispersible resin dissolved or dispersed in an organic solvent is neutralized with a base, phase reversal of emulsion into an aqueous medium is carried out. The anion-type self water-dispersible resin dissolved or dispersed in an organic solvent after it is neutralized with a base undergoes instantaneous conversion of resin phase from W/O to O/W by addition of an aqueous medium and resin particles are generated in the aqueous medium. A conventional polymerization method comprises two steps, i.e., first, formation of crude unit particles of fine particles, i.e., unit particles (many of them are liquid) which are not yet a resin particle but upon polymerization reaction, can become fine resin particles by polymerization reaction, and subsequent formation of resin fine particles (polymerization reaction). Each of them is independently carried out as a separate step. On the contrary, the present invention has the feature that the steps are not separated, but both simultaneously and instantaneously proceed by utilizing phase reversal of emulsion.

The base used in the second step includes as an inorganic basic compound, hydroxides of alkali metals such as sodium hydroxide, potassium hydroxide and lithium hydroxide, and carbonates, acetates thereof, and ammonia. As the organic basic compound, there can be used alkylamines such as methylamine, dimethylamine, trimethylamine, ethylamine, diethylamine, and triethylamine, alkanolamines such as diethanolamine, and so on. The basic compounds may be used as they are but usually they are used in the form of an aqueous solution.

Then, the second step in the present invention includes in addition to the formation of fine resin particles, control of particle diameter, which is another important factor. Basically, the control of particle diameter is realized by controlling the amount of a base which neutralizes the acid group contained in the anion-type self water-dispersible resin. In the method of the present invention, the amount neutralized with base (amount of base required for neutralization) is appropriately varied within the range of 10 to 100 mole % so that particle diameters ranging from submicrons (below 1 $\mu$m) to 30 $\mu$m can be freely obtained. The ease of control of particle diameter is also one of the features of the present invention. In addition, since particle formation in the aqueous medium is realized by substantially utilizing the self water-dispersibility of a resin called phase reversal of emulsion, application of shear to such an extent that various solvents and solutes are uniformly mixed can give rise to fine resin particles having a normal distribution in size without a particular means.

As an apparatus which can be used for the phase reversal of emulsion in the second step is a conventional stirrer. In particular, when the particle diameter is to be controlled to submicrons or smaller, use of an emulsifier-disperser or the like is more preferred. For example, there can be used what is generally called a high speed shearing turbine type disperser, such as a Homomixer (manufactured by Tokushu Kika Kogyo Co.), Disper (manufactured by Tokushu Kika Kogyo Co.), Ultra Tarax (Germany), Chedimill (U.S.A.), Shear Flow (U.S.A.), Silverson Mixer (United Kingdom), Haller Homogenizer (Germany), etc. Further, there can be cited a continuous emulsifier-disperser comprising a high speed rotation rotor and a stator engaged therewith, such as a Slasher (manufactured by Mitsui Mining Co., Ltd.) or Cavitron (manufactured by Eurotech Co., Ltd.), an emulsifier-disperser utilizing interaction of a chamber of a special shape and energy supplied to a pump, such as a Microfluidizer (manufactured by Mizuho Kogyo Co., Ltd.), Microhomogenizer (manufactured by Mizuho Kogyo Co., Ltd.), Munton-Golin Homogenizer, (manufactured by Golin Co.), Nanomizer (manufactured by Nanomizer Co., Ltd.), stationary type in-pipe continuous mixer having no driving portion, such as a Static Mixer (manufactured by Noritake Co.).

Here, too weak a shear till phase reversal tends to broaden the particle size distribution. Too strong a shear will destroy the generated particles to generate agglomerates or extremely fine particles or broadens the particle size distribution. In such cases, however, since a normal distribution is size of the fine particles of the present invention can be obtained, classification, if necessary, of only a portion thereof will be sufficient for further adjusting the particle size distribution. The classified fine resin particles are returned to the first step and redissolved or redispersed in an organic solvent before they can be reused.

The fine resin particles of the present invention are able to be used as they are. However, it is desirable to remove the organic solvent in vacuo. It is of course possible to remove the aqueous medium to form powdery dry resin fine particles.

The third step is to remove the organic solvent or aqueous medium to obtain powdery dry fine resin particles. The fine resin particles obtained in the second step are dispersed in an aqueous medium so that first a wet cake of resin particles is obtained by suction filtration and then dried by a jet mill, etc. or by a common method by use of a spray drier, etc. to obtain powdery fine resin particles.

The resin particles obtained by phase reversal of emulsion as described above can be used in a proportion of 20 to 90% by weight, preferably 30 to 70% by weight as a component ratio of resin particle in the heat-sensitive composition layer. When the component ratio of the resin particle is less than 20% by weight, the change in physical characteristics due to thermal denaturation becomes excessive causing problems with the quality of the image portion, while above 90% by weight of component ratio results in insufficient change in physical characteristics, and problems will arise in the developability and the like in the first development.

A fluorine base surfactant is added to the heat-sensitive composition layer of the present invention. The effect of the fluorine base surfactant is, first of all, the effect of a leveling agent which improves the coating quality upon coating a coating solution of a heat-sensitive composition layer on the surface of a PS plate. Its second effect is the effect of increasing dispersibility by neutralizing the cohesion based on the interaction between the particles such as resin particles and carbon black contained in the coating solution of the heat-sensitive composition layer. The third effect is the effect on the adhesion between the heat-sensitive composition layer after coating and drying and a negative- or positive-type light-sensitive image forming layer, to have an effect on the releasability of the heat-sensitive composition layer. The fourth effect is the effect on the solubility of the heat-sensitive composition layer in a developer in the first and/or second development.

Specific examples of the fluorine base surfactant include anionic fluorine base surfactant such as perfluoroalkyl group-containing carboxylic acid salts, perfluoroalkyl group-containing sulfonic acid salts, perfluoroalkyl group-containing sulfuric acid esters and perfluoroalkyl group-containing phosphoric acid salts, cationic fluorine base surfactants such as perfluoroalkyl group-containing amine salts and perfluoroalkyl group-containing quaternary ammonium salts, amphoteric fluorine base surfactants such as perfluoroalkyl group-containing carboxybetaine and perfluoroalkyl group-containing aminocarboxylic acid salts, nonionic fluorine base surfactants such as perfluoroalkyl group-containing oligomers, perfluoroalkyl group-containing polymers and perfluoroalkyl group-containing sulfonamide polyethylene glycol adducts, etc.

These fluorine base surfactants may be used singly or two or more of them may be used in combination. Further, the amount of the fluorine base surfactant in the heat-sensitive composition layer of the present invention is 0.001 to 20% by weight, preferably 0.01 to 10% by weight, based on the solids in the heat-sensitive composition layer. If the amount is less than 0.001% by weight, sufficient leveling effect cannot be obtained when coating a coating solution of heat-sensitive composition layer on a PS plate. When above 20% by weight of the surfactant is added, there occurs a problem in the developability in the first development, such as peeling off of the whole heat-sensitive composition layer.

Provision of the heat-sensitive composition layer of the present invention on the light-sensitive image forming layer can be achieved by coating a coating solution of heat-sensitive composition layer on the light-sensitive image forming layer of a negative- or positive-type PS plate and drying. The coating solution of light-sensitive composition layer is prepared, for example, by dispersing a pigment in water or a mixed solvent of water and an organic solvent. As the dispersing machine, there can be used an ultrasonic disperser, a sand mill, an attritor, a barrel mill, a super mill, a ball mill, an impeller, a disperser, a KD mill, a colloid mill, a dynatron, a three-roll mill, a pressure kneader, etc. The organic solvent used at this time is an organic solvent having a low boiling point which can dissolve in water uniformly, specific examples of which include methanol, ethanol, isopropanol, n-propanol, butanol, sec-butanol, t-butanol, acetone, methyl ethyl ketone, ethylene glycol, propylene glycol, propylenetriol, acetic acid, propionic acid, etc.

Further, in the case of grafted carbon black, it is preferred to use an additive simultaneously with the dispersion in order to stabilize it in the dispersion solvent. The additive, as cations which constitute counter ions for the grafting agent, includes various lower organic primary amines, secondary amines, tertiary amines, quaternary ammonium salts, inorganic ions such as alkali metals, alkaline earth metals, and as anions, various organic carboxylic acids, organic sulfonic acids, organic phosphoric acids, aminocarboxylic acids, etc. As other additives for stabilization, there can be cited various surfactants. As the surfactants, there can be selected those which do not corrode the heat-sensitive composition layer of a PS plate or cause cissing upon coating on a PS plate as described hereinbelow. More specifically, anionic surfactants such as various carboxylic acid salts, sulfonic acid salts, sulfuric acid esters, phosphoric acid salts, etc., cationic surfactants such as aliphatic amine salts and quaternary ammonium salts thereof, aromatic quaternary ammonium salt, heterocyclic quaternary ammonium salts, etc. Preferably, fluorine base surfactants are used.

In case the fine resin particle of anion-type self water-dispersible resin of the present invention is dispersed in an aqueous medium and contains a necessary amount of resin, after the second step for the preparation of fine resin particles of the above-described anion-type self water-dispersible resin, the aqueous medium containing the resin particles is used as it is by adding it to a liquid for the preparation of a pigment previously prepared.

On the other hand, when the resin particles are obtained as powdery fine particles, they are forcibly dispersed in water and/or water-soluble organic solvent to form a uniform solution and thereafter added to a previously prepared liquid for preparing a pigment. At this time, use of forcible dispersion tends to cause agglomeration between the particles when the base is not sufficiently neutralized. As the base which is preferably used in this case, there can be cited various lower organic primary amines, secondary amines, tertiary amines, quaternary ammonium salts, and inorganic ions such as alkali metals, alkaline earth metals.

Next, a predetermined amount of fluorine base surfactant, as it is directly or after dissolving in water and/or water soluble organic solvent, may be added to the previously prepared mixed solution of pigment and resin particles.

The order of addition of the dispersion of pigment, resin particle dispersion, and the fluorine base surfactant solution may be of various types and there is no need to follow what is described herein. Any mixing method may be used.

The coating solution of heat-sensitive composition layer may further contain a coating aid for improving coatability. For example, in order to adjust the viscosity, there can be added various natural water-soluble polymers or synthetic water-soluble polymers, water-soluble organic solvents (methanol, ethanol, isopropanol, n-propanol, butanol, sec-butanol, t-butanol, acetone, methyl ethyl ketone, ethylene glycol, propylene glycol, propylenetriol, acetic acid, propionic acid, etc.), defoaming agents (silicone base and fluorine base, etc.), various surfactants (anionic, nonionic, cationic), etc.

The coating solution of heat-sensitive composition layer thus prepared is coated on the light-sensitive image forming layer of a negative- or positive-type PS plate which has been stripped of the surface matting agent, preferably after adjusting the solids content of the coating liquid to 1 to 50% by weight. As the coating method, there can be cited a rotary coating method, a wire bar coating method, a dip coating method, an air knife coating method, a roll coating method, a blade coating method, a curtain coating method, a spray coating method, etc.

The coating liquid of the heat-sensitive composition layer coated on the negative- or positive-type PS plate is dried at 30 to 150° C. for 10 seconds to 10 minutes using a hot air drier, infrared drier, etc. The coating amount of the heat-sensitive composition layer after the drying is 0.5 to 3.5 g/m$^2$. If the coating amount is less than 0.5 g/m$^2$, the masking effect by the heat-sensitive composition layer upon flood exposure with active light is insufficient, while if the coating amount is above 3.5 g/m², sufficient thermal energy cannot be obtained upon inscribing by high energy density light and the whole heat-sensitive composition layer may peel off in the first development.

The original plate for a lithographic printing plate of the present invention prepared as described above has a structure such that the heat-sensitive composition layer is coated as a masking layer on a PS plate which is known in the printing industry. In the original plate for a lithographic printing plate coated with the heat-sensitive composition layer on the light-sensitive image forming layer of a "negative-type PS plate", an image portion on which inscription is performed with high energy density light melts and serves as a non-image portion when used as a printing plate. The image portion of the heat-sensitive composition layer on which an image is inscribed with high energy density light functions as a mask upon subsequent flood UV exposure. The light-sensitive image forming layer of the PS plate where the mask has been removed cures upon the flood UV exposure to form an image portion upon printing. In this case, the original plate for a printing plate may be called a "positive-type original plate for a lithographic printing plate" from the viewpoint of inscribing with high energy density light.

On the other hand, in the case of the original plate for a lithographic printing plate of the present invention having coated the heat-sensitive composition layer on the light-sensitive image forming layer of a "positive-type PS plate", the image portion where inscription has been performed with high energy density light serves as an image portion where an ink is deposited when it is used as a printing plate, and in this case it may. be called a "negative-type original plate for a lithographic printing plate".

Further, by the masking effect of the uppermost heat-sensitive composition layer, the phenomenon of fogging caused by ultraviolet rays on the negative- or positive-type PS plate can be prevented so that the original plate for a lithographic printing plate of the present invention is advantageous since when handling, it does not require any additional appliance such as a special safety light but can be operated under an ordinary lit room lamp.

A negative-type PS plate which can be used as a substrate for the original plate for a lithographic printing plate of the present invention will be described. No particular limitation is posed on the negative-type PS plate and there can be used any commercially available negative-type PS plate that has a support having a hydrophilic surface (at present the most popular one is an aluminum substrate whose surface has been subjected to hydrophilization treatment) on which is coated a negative-type light-sensitive image forming layer (the image-wise exposed portion serves as an ink receiving portion).

Representative examples of the light-sensitive composition contained in the light-curing light-sensitive layer of such a negative-type light-sensitive lithographic printing plate include the following.
1) light-sensitive composition comprising a light-sensitive diazo resin and a binder resin: a representative examples of the light-sensitive diazo resin include a salt of a condensation product of diazodiarylamine and active carbonyl compound. A water-insoluble and organic solvent-soluble diazo resin is preferred. Particularly preferred diazo resins include organic acid salts or inorganic acid salts of condensation products between 4-diazodiphenylamine, 4-diazo-3-methyldiphenylamine, 4-diazo-4'-methyldiphenylamine, 4-diazo-3'-methyldiphenylamine, 4-diazo-3-methyl-4'-ethoxydiphenylamine, 4-diazo-3-methoxydiphenylamine, etc. and formaldehyde, paraformaldehyde, acetaldehyde, benzaldehyde, 4,4'-bis(methoxymethyl)diphenyl ether, etc. The organic acid includes, for example, methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, 2-hydroxy-4-methoxybenzophenone-5-sulfonic acid, 2,4-dihydroxybenzophenone, benzenephosphinic acid, etc. The inorganic acid includes hexafluorophosphoric acid, tetrafluoroboric acid, etc.

As other light-sensitive diazo resins, there can be used those diazo resins having a polyester group in their main chain as described in Japanese Patent Unexamined Publication No. 54-30121; diazo resins obtained by reacting a polymer having a carboxylic anhydride residue with a diazo compound having a hydroxyl group as described in Japanese Patent Unexamined Publication No. 61-273538; diazo resins obtained by reacting a polyisocyanate compound with a diazo compound having a hydroxyl group, and the like.

As the binder resin, there can be used, for example, (meth)acrylic acid (hereafter, acrylic acid and methacrylic acid are collectively referred to as "(meth)acrylic acid"), copolymers such as (meth)acrylic acid ester copolymers, hydroxyalkyl (meth)acrylate and (meth)acrylonitrile-containing copolymer having an acid value of 10 to 100 as described in U.S. Pat. No. 4,123,276, copolymers having an aromatic hydroxyl group as described in Japanese Patent Publication No. 57-43890; polymers having a 2-hydroxy-3-phenoxypropyl (meth)acrylate unit as described in Japanese Patent Publication No. 57-51656; epoxy resins; polyamide resins; vinyl halide, in particular, polyvinyl chloride, polyvinylidene chloride; polyvinyl acetate; polyesters; acetal resins such as formal resins and butyral resins; soluble polyurethane resins commercially available from U. S. Goodrich under a trade name ESTAL; polystyrenes; styrene/maleic anhydride copolymers or half esters thereof; cellulose derivatives; shellac; rosin or its modified product; etc.
2) Light-sensitive composition containing photo-crosslinkable type resin: as the photo-crosslinkable resin is preferred a photo-crosslinkable resin having an affinity for an aqueous alkali developer. There can be used, for example, a copolymer having a cinnamic acid group and a carboxyl group as described in Japanese Patent Publication No. 54-15711; a polyester resin having a phenylenediacrylic acid residue and a carboxyl group as described in Japanese Patent Unexamined Publication No. 60-165646; a polyester resin having a phenylenediacrylic acid residue and a phenolic hydroxyl group as described in Japanese Patent Unexamined Publication No. 60-203630; a polyester resin having a phenylenediacrylic acid residue and a sodium iminodisulfonyl group as described in Japanese Patent Publication No. 57-42858; a polymer having an azide group and a carboxyl group in the side chains thereof as described in Japanese Patent Unexamined Publication No. 59-208552; a polymer having a maleimide group in the side chains thereof as described in Japanese Patent Unexamined Publication No. 62-78544, etc.
3) Light-sensitive composition containing an addition-polymerizable unsaturated compound and a photopolymerization initiator: as the light-sensitive composition, there are, for example, compositions comprising an addition-polymerizable unsaturated compound having two or more of terminal ethylene groups and a light polymerization initiator as described in U.S. Pat. Nos. 2,769,863 and 3,060,023, and Japanese Patent Unexamined Publication No. 62-121448, etc. Further, as the binder resin, there can be used the binder resin described in 1) above, a copolymer having an unsaturated group in the side chain thereof as described in Japanese Patent Unexamined Publication No. 61-285449. The above-described light-sensitive composition, if desired after addition of one or more of dyestuffs, pigments, stabilizers, fillers, crosslinking agents, etc., is dissolved in a suitable solvent and the resulting solution is coated on a support and dried to form a negative-type light-sensitive lithographic printing plate having a light-sensitive layer of usually 0.5 to 5 $g/m^2$.

As the support for the above-described negative-type light-sensitive image forming layer, there can be cited, for example, plates of metal such as aluminum, zinc, copper, stainless steel, iron, etc.; films of plastics such as polyethylene terephthalate, polycarbonate, polyvinyl acetal, polyethylene, etc.; a composite material such as paper or plastic film which has been coated with a synthetic resin solution and which is provided with a metal layer by vacuum deposition, lamination or similar technology; and the like. Of these, particularly preferred are an aluminum support and a composite support covered with aluminum.

The surface of the aluminum support is desirably surface-treated for the purpose of increasing water retention and improving the adhesion with the light-sensitive layer. For example, surface roughening methods include a brush polishing method, a ball polishing method, electrolytic etching, chemical etching, liquid honing, sand blasting and combinations of these. A surface roughening method including the use of electrolytic etching is particularly preferred.

The electrolytic bath used upon electrolytic etching includes aqueous solutions containing an acid, an alkali or their salts or an aqueous solution containing an organic solvent. Of these, particularly preferred are those electrolytes containing hydrochloric acid, nitric acid or their salts. Further, aluminum plates subjected to surface roughening treatment, if desired, may be subjected to desmutting treatment with an aqueous solution of acid or alkali. The aluminum plate thus obtained is desirably anodized and a method is desirable which uses for the treatment a bath containing sulfuric acid or phosphoric acid.

Further, if desired, there can be carried out various treatments, for example, a silicate treatment (sodium silicate, potassium silicate) as described in U.S. Pat. Nos. 2,714,066 and 3,181,461, a potassium zirconium fluoride treatment as described in U.S. Pat. No. 2,946,638, a phosphomolybdate treatment as described in U.S. Pat. No. 3,201, 247, alkyl titanate treatment as described in United Kingdom Patent No. 1,108,559, a polyacrylic acid treatment as described in German Patent No. 1,091,433, a polyvinylphosphonic acid treatment as described in German Patent No. 1,134,093 and United Kingdom Patent No. 1,230,447, a phosphonic acid treatment as described in Japanese Patent Publication No. 44-6409, a phytic acid treatment as described in U.S. Pat. No. 3,30,951, a treatment with a salt of a hydrophilic organic high molecular compound and a divalent metal as described in Japanese Patent Unexamined Publication No. 58-18291, a hydrophilic treatment by undercoating a water-soluble polymer having a sulfonic acid group as described in Japanese Patent Unexamined Publication No. 59-101651, a coloring treatment with an acid dye as described in Japanese Patent Unexamined Publication No. 60-64352, a silicate electrodeposition treatment as described in U.S. Pat. No. 3,658,662, etc.

It is also preferred that the substrates are subjected to sealing treatment for sealing pore cavities after sand blasting and anodizing. The sealing treatment can be carried out by dipping in a hot aqueous solution containing hot water and inorganic salt or organic salt and steam bath, etc.

The negative-type PS plate used in the present invention can be produced by coating a negative-type light-sensitive composition layer on the above-described support and drying by conventional techniques. As the coating method, there can be cited a rotary coating method, a wire bar coating method, a dip coating method, an air knife coating method, a roll coating method, a blade coating method, a curtain coating method, a spray coating method, etc. The negative-type light-sensitive composition layer thus coated is dried at 40 to 150° C. for 30 seconds to 10 minutes using hot air drier, infrared drier, etc.

The positive-type PS plate used as a substrate for the original plate for a lithographic printing plate of the present invention will be described. No particular limitation is posed on the positive-type PS plate and there can be used any commercially available positive-type PS plate that has a support having a hydrophilic surface (at present the most popular one is an aluminum substrate whose surface has been subjected to hydrophilization treatment) on which is coated a positive-type light-sensitive image forming layer (non-image wise portion serves as an ink receiving portion).

Representative examples of the light-sensitive composition contained in the light-curing light-sensitive layer of such a positive-type light-sensitive lithographic printing plate include the following.

Representative examples of the light-sensitive layer composition of the positive-type PS plate which can be used in the original plate for a lithographic printing plate of the present invention include o-quinone diazide compounds, acid-decomposable ether compounds and ester compounds. Specific examples of o-quinone diazide compounds include those described in Japanese Patent Unexamined Publications Nos. 47-5303, 48-63802, 48-63803, 49-38701, 56-1044, and 56-1045, Japanese Patent Publication Nos. 41-11222, 43-28403, 45-9610, and 49-17481, U.S. Pat. Nos. 2,797,213, 3,046,120, 3,188,210, 3,454,400, 3,544,323, 3,573,917, 3,674,495, and 3,785,825, United Kingdom Patent Nos. 1,227,602, 1,251,345, 1,267,005, 1,329,888, and 1,330,932, German Patent No. 854,890, etc., examples of the acid-decomposable compounds include Japanese Patent Unexamined Publications Nos. 60-37549, 60-10247, and 60-3625, etc. These compounds may be used singly or in combination as a light sensitive component to form a light-sensitive material, to which the present invention can be applied advantageously. The light-sensitive component includes o-quinone diazide carboxylic acid ester, i.e., an aromatic hydroxy compound, and o-quinone diazide sulfonic acid or o-quinone diazide carboxamide, i.e., an aromatic amino compound, and also those consisting of o-quinone diazide compound alone or those having a light-sensitive layer comprising a mixture of the o-quinone diazide compound with an alkali-soluble resin.

The alkali-soluble resin includes novolak type phenol resins, more particularly., phenol/formaldehyde resin, cresol/formaldehyde resin, phenol-cresol-mixed formaldehyde resin, cresol-xylenol-mixed aldehyde resin, etc. Further, there can be applied an alkali-soluble resin which comprises, together with the above-described phenol resin, a condensation product between phenol or cresol substituted with an alkyl group having 3 to 8 carbon atoms with formaldehyde, such as t-butylphenolformaldehyde, as described in Japanese Patent Unexamined Publication No. 50-125806. The light-sensitive layer containing o-quinone diazide as a light-sensitive component may if desired contain further additives such as dye, plasticizers, a component for imparting printout properties, etc. In the present invention, the amount of the light-sensitive layer containing o-quinone diazide as a light-sensitive component per unit area is preferably 0.5 to 7 $g/m^2$.

As the support for the above-described positive-type light-sensitive image forming layer, there can be used a substrate similar to that whose surface has been subjected to hydrophilization treatment which was prepared as a support for the negative-type light-sensitive image forming layer. That is, preferably aluminum or a surface of a composite support covered with aluminum is surface-treated for the purpose of increasing water retention and improving the adhesion with the light-sensitive layer. For example, surface roughening methods include a brush polishing method, a ball polishing method, electrolytic etching, chemical etching, liquid honing, sand blasting and combinations of these. A surface roughening method including the use of electrolytic etching is particularly preferred. Further, aluminum plates subjected to surface roughening treatment, if desired, may preferably be subjected to desmutting treatment with an aqueous solution of acid or alkali and anodized. Particularly, a method is desirable which uses for the treatment a bath containing sulfuric acid or phosphoric acid. Further, if desired, it is preferred to carry out the treatments described with respect to the substrate treatment of the above-described negative-type PS plate, e.g., a silicate treatment, a potassium zirconium fluoride treatment, a phosphomolybdate treatment, alkyl titanate treatment, a polyacrylic acid treatment, a polyvinylphosphonic acid treatment, a phosphonic acid treatment, a phytic acid treatment, a treatment with a salt of a hydrophilic organic high molecular compound and a divalent metal, a hydrophilic treatment by undercoating a water-soluble polymer having a sulfonic acid group, a coloring treatment with an acid dye, a silicate electrodeposition treatment, etc. It is also preferred that the substrates are subjected to sealing treatment for sealing pore cavities after sand blasting and anodizing. The sealing treatment can be carried out by dipping in a hot aqueous solution containing hot water and a inorganic salt or organic salt, by steam bath, etc.

The positive-type PS plate used in the present invention can be produced by coating a positive-type light-sensitive composition layer on the above-described support and drying by conventional techniques. As the coating method, there can be cited a rotary coating method, a wire bar coating method, a dip coating method, an air knife coating method, a roll coating method, a blade coating method, a curtain coating method, a spray coating method, etc. The positive-type light-sensitive composition layer thus coated is dried at 40 to 150° C. for 30 seconds to 10 minutes using a hot air drier, infrared drier, etc.

Next, the method for preparing a printing plate using the original plate for a lithographic printing plate of the present invention will be described.

The original plate for a lithographic printing plate of the present invention is a so-called computer-to-plate (CTP) plate, which allows direct image inscription onto the plate using high energy density light based on digital image information from a computer or the like. The high energy density light source which can form images on the original plate for a lithographic printing plate of the present invention includes various semiconductor lasers having lasing wavelengths of 300 to 950 nm, carbon dioxide gas laser (lasing wavelength: 10.6 nm), YAG laser (lasing wavelength: 532 nm, 1064 nm), excimer laser (lasing wavelength: 193 nm, 308 nm, 351 nm), Argon laser (lasing wavelength: 488 nm), etc. In each case, such an optical source can be used by selecting a pigment which can absorb light with a specified wavelength of the optical source and convert it to heat from among the above-described pigments and adding the selected pigment to the heat-sensitive composition layer.

The heat-sensitive composition layer of the present invention is stripped of its non-image portion by a wet method in the first development after images are inscribed with high energy density light. The developer (hereafter, referred to as "the first developer") is an alkaline aqueous solution containing an alkali agent.

The developer used in the first development in the present invention is suitably an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogen carbonate, ammoniacal water, etc. and an organic alkali agent such as tetraalkylammonium hydride. They are added so that their concentration is 0.005 to 20% by weight, preferably 0.01 to 5% by weight.

The first developer may optionally contain various surfactants such as anionic surfactants, nonionic surfactants, cationic surfactants, amphoteric surfactants, fluorine base surfactants, and silicone base surfactants and water-soluble organic solvents such as alcohols.

As the first developer, there can be used practically those developers for positives which are usually commercially available, after 1 to 200 fold dilution. If desired, it is possible to carry out development using a developer for both a positive and a negative after 1 to 200 fold dilution.

The processing of the first development in the present invention is carried out at a temperature of 15 to 40° C. for 1 second to 2 minutes, by dipping the original plate for a lithographic printing plate of the present invention in the first developer and subsequently washing it with water. If desired, the surface of the original plate may be rubbed lightly. Also, use of an automatic developing machine filled with the first developer is effective.

After the first development processing is completed, the image inscribed on the heat-sensitive composition layer is formed as a mask image on the negative-type or positive-type light-sensitive image forming layer. Then, the original plate for a lithographic printing plate of the present invention of which the first development is completed is subjected to flood exposure with active light. This flood exposure causes the mask image to be transferred to the underlying negative-type or positive-type light-sensitive image forming layer. The active light may be from an active light source which is usually used in printers and the like in the art. As examples, there are a mercury lamp, a metal halide lamp, a xenon lamp, a chemical lamp, a carbon arc lamp, etc. As printers and other appliances, various printers and the like which are known in the art may be used as they are.

At the stage at which images are inscribed with high energy density light to the heat-sensitive composition layer of original plate for a lithographic printing plate of the present invention, the first development is carried out, and the flood exposure to active light is completed, there is an image-like heat-sensitive composition layer attached to the surface of the negative-type or positive-type PS plate to which the images of the heat-sensitive composition layer were transferred. The heat-sensitive composition layer attached to the surface of the PS plate, if it remains as attached until the stage of printing, will mix into the printed matter irregularly and spot the print. Accordingly, this should be removed in advance, before a printing plate is obtained. However, the remaining heat-sensitive composition layer can be peeled and removed together with the non-image portion composition layer of the PS plate by effecting the development processing (the second development) of the negative-type or positive-type PS plate.

The second development according to the present invention can be carried out in accordance with an operational procedure similar to that of the general negative-type or positive-type PS plate. That is, in the case of the positive-type original plate for a lithographic printing plate which has a heat-sensitive composition layer on the negative-type PS plate, the same development processing as that for usual negative-type PS plates may be carried out as the second development processing.

That is, specific examples of the alkali agent used for the development of negative-type PS plates include inorganic alkali agents such as sodium silicate, potassium silicate, sodium hydroxide, potassium hydroxide, lithium hydroxide, sodium or ammonium secondary or tertiary phosphate, sodium metasilicate, sodium hydrogen carbonate, ammonia, etc. and an organic alkali agent such as mono-, di- or trimethylamine, mono-, di- or triethylamine, mono- or diisoproppylamine, n-butylamine, mono-, di- or triethanolamine, mono-, di- ortriisopropanolamine, ethyleneimine, ethylenediimine, etc.

The content of the alkali agent is 0.005 to 10% by weight, preferably 0.05 to 5% by weight. If the content is less than 0.05% by weight, development fails while a content above 10% by weight adversely affects the negative-type light-sensitive image forming layer, such as by corrosion upon the second development.

The developer for negative-type PS plate may contain an organic solvent, specific examples of which include ethyl acetate, propyl acetate, butyl acetate, amyl acetate, benzyl acetate, ethylene glycol monobutyl acetate, butyl lactate, butyl levurate, ethyl butyl ketone, methyl isobutyl ketone, cyclohexanone, ethylene glycol monobutyl ether, ethylene glycol benzyl ether, ethylene glycol monophenyl ether, benzyl alcohol, methyl phenyl carbinol, n-amyl alcohol, methylamyl alcohol, xylene, methylene dichloride, ethylene dichloride, monochlorobenzene, etc.

The content of the organic solvent is 20% by weight or less, preferably 10% by weight or less.

Further, the developer for a negative-type PS plate may if desired contain water-soluble sulfites such as lithium sulfite, sodium sulfite, potassium sulfite and magnesium sulfite, alkali-soluble pyrazolone compounds, alkali-soluble thiol compounds, hydroxyaromatic compounds such as methylresorcinol, water softeners such as polyphosphoric acid salts and aminopolycarboxylic acids, anionic or ampho-teric surfactants such as sodium isopropylnaphthalenesulfonate, sodium n-butylnaphthalenesulfonate, sodium N-methyl-N-pentadecylaminoacetate, and sodium laurylsulfate, defoaming agent, etc.

The composition of the developer for negative-type PS plate used in the present invention may be the above-described composition. Practically, there may be used commercially available developers used in the development processing of negative-type PS plate. The commercially available concentrated type developers for negatives after diluting them 1 to 20 fold, can be used as the developer for the second development of the positive-type original plate for a lithographic printing plate of the present invention.

The processing of the second development of the positive-type original plate for a lithographic printing plate of the present invention is carried out at a temperature of 15 to 40° C. for 1 second to 2 minutes, by dipping the positive-type original plate for a lithographic printing plate after flood exposure with active light in the second developer and subsequently washing it with water. If desired, the surface of the original plate may be rubbed lightly. At this point, the mask layer composed of the remaining heat-sensitive composition layer is peeled and removed during the second development processing. Also, use of an automatic developing machine filled with the second developer is effective.

On the other hand, in the case of the negative-type original plate for a lithographic printing plate of the present invention which is coated with a heat-sensitive composition layer on a positive-type PS plate, development processing similar to that of usual positive-type PS plates may be carried out as the second development processing. That is, the processing of the second development is carried out at a temperature of 15 to 40° C. for 1 second to 2 minutes. As the second developer, there can be practically used those commercially available developers for positives or developers for both positives and negatives. If desired, the development may be carried out with addition of some additives such as organic solvents. In the second development processing, the mask layer composed of the remaining heat-sensitive composition layer is peeled and removed during the second development processing.

The developer used in the second development of the negative-type original plate for a lithographic printing plate of the present invention is suitably an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogen carbonate, ammoniacal water, etc. and an organic alkali agent such as tetraalkylammonium hydride. They are added so that their concentration is 0.1 to 20% by weight, preferably 0.5 to 10% by weight.

The second developer may optionally contain various surfactants such as anionic surfactants, nonionic surfactants, cationic surfactants, amphoteric surfactants, fluorine base surfactants, etc., and water-soluble organic solvents such as alcohols.

Further, the second developer for positive-type PS plates used as a substrate for the original plate for a lithographic printing plate of the present invention may, within a range which does not corrode the positive-type PS plate, contain an organic solvent, specific examples of which include ethyl acetate, propyl acetate, butyl acetate, amyl acetate, benzyl acetate, ethylene glycol monobutyl acetate, butyl lactate, butyl levurate, ethyl butyl ketone, methyl isobutyl ketone, cyclohexanone, ethylene glycol monobutyl ether, ethylene glycol benzyl ether, ethylene glycol monophenyl ether, benzyl alcohol, methyl phenyl carbinol, n-amyl alcohol, methylamyl alcohol, xylene, methylene dichloride, ethylene dichloride, monochlorobenzene, etc. The amount to be used is less than 5% by weight.

The original plate for a lithographic printing plate of the present invention after the second development is subjected to washing with water and/or treatment with an aqueous desensitizer. As the aqueous desensitizer, there can be cited water-soluble natural polymers such as gum Arabic, dextrin, and carboxymethylcellulose; water-soluble synthetic polymers such as polyvinyl alcohol, polyvinylpyrrolidone, and polyacrylic acid. If desired, acids, surfactants, etc. may be added to the aqueous desensitizers. Thereafter, the desensitizers are dried and used for printing as a printing plate.

A preferred method for preparing a good printing plate using the original plate for a lithographic printing plate of the present invention is to first attach the original plate for a lithographic printing plate of the present invention to an image exposure machine using high energy density light such as YAG laser, infrared semiconductor laser, etc., as an optical source and directly inscribe images based on digital information from a computer on the original plate for a lithographic printing plate of the present invention. On this occasion, the original plate for a lithographic printing plate of the present invention has the feature that it does not require any special safety light for handling it before or after exposure but can be operated under usual room light.

Then, using the first developer obtained by diluting a commercially available developer for positive-type PS plates, the first development is carried out to remove the non-image portion. Subsequently, flood exposure is carried out using a printer or the like equipped with an active light source used in printing usual PS plates. In this case, usually the exposure conditions are the same as those for the negative-type or positive-type PS plate used as a substrate of the original plate for a lithographic printing plate of the present invention.

After flood exposure with active light, the original plate for a lithographic printing plate of the present invention is subjected to the second development with a commercially available developer for negative-type PS plate or positive-type PS plate. In this case, the development conditions may usually be the same as those for the for the negative-type or positive-type PS plate used as a substrate of the original plate for a lithographic printing plate of the present invention. However, the developer for the positive-type PS-plate may contain, if desired, some organic solvents. The image-like heat-sensitive composition layer must be removed. This is peeled and removed during the second development processing. Thereafter, the resulting plate is subjected to washing with water and/or treatment with an aqueous desensitizer and dried to obtain a printing plate.

The steps subsequent to the first development may be practiced one by one. Practically, it is easy and preferable to use an automatic processing machine which can operate these steps throughout.

EXAMPLES

The present invention will be described in more detail. However, the present invention is not construed as being limited thereto.

Reference Example 1

Synthesis Example of Acrylic Polymer Fine Particles

In a 1L four-necked flask equipped with a stirrer, a condenser, a dry nitrogen introduction pipe with a thermometer, and a dripping apparatus was charged 400 parts of methyl ethyl ketone and the temperature was elevated to 80° C. A solution of 80 parts of styrene, 238.9 parts of methyl methacrylate, 24.5 parts of methacrylic acid, 56.6 parts of butyl acrylate, and 8 parts of PERBUTYL-O (trade name for a polymerization initiator manufactured by Nippon Oil & Fats Co., Ltd.) well mixed was dripped over 2 hours. After 8 hours of stirring, 0.5 part of PERBUTYL-O was added and the mixture was stirred for an additional 8 hours to obtain an acrylic polymer having a dry solids ratio of 49.5%, an acid value of 39.1, and a number average molecular weight of 20,000. The dry solids ratio was determined by weighing about 1 part of a sample solution and again weighing it after drying at 120° C. for 1 hour and calculating the ratio of the two weights. The number average molecular weight was measured by gel permeation chromatography (GPC) and expressed in molecular weight terms of polystyrene. The acid value was determined by weighing a predetermined amount of a sample solution and titrating with a methanol solution of potassium hydroxide at a known concentration.

The above-described acrylic polymer solution (100 parts) was neutralized with 2.71 parts of triethylamine, and while stirring, water was dripped. The prepolymer solution increased its viscosity slowly. When about 150 parts of water was dripped, the viscosity decreased abruptly, which indicated that the phase reversal was completed. After further addition of 150 parts of water, the resulting dispersion was heated to 30° C. and the organic solvent and excess water were removed under reduced pressure to obtain an aqueous dispersion of acrylic polymer fine particles having a dry solids ratio of 33.7% and an average particle diameter of 120 nm. The particle diameter was measured using MICROTRAC UPA-150, which is an ultrafine particle analyzer of a single modular light scattering system.

Reference Example 2

Synthesis Example of Polyester Fine Particles

In a 2L four-necked flask equipped with a stirrer, a distillation tube, a dry nitrogen introduction pipe, and a thermometer, were charged 397.6 parts of terephthalic acid, 397.6 parts of isophthalic acid, 144.9 parts of ethylene glycol, and 243.6 parts of neopentyl glycol and the temperature was elevated to 160° C. After addition of 0.5 part of dibutyltin oxide, the temperature was elevated to 260° C. over 6 hours to carry out a dehydration reaction. Then, the distillation tube was replaced with a decanter and 30 parts of xylene was added. While removing water at 260° C. by azeotropic distillation, stirring was continued for an additional 4 hours. Finally, the temperature was decreased and the reaction mixture was diluted with 500 parts of methyl ethyl ketone to obtain polyester having a carboxyl group at each terminal and having an acid value of 19.3 and a dry solids ratio of 65.5%. The acid value was determined by weighing a predetermined amount of a sample solution and titrating with a methanol solution of potassium hydroxide at a known concentration. The dry solids ratio was determined by weighing about 1 part of a sample solution and also weighing it after drying at 120° C. for 1 hour and calculating the ratio of the two weights.

To 100 parts of the above-described polyester solution was added 30 parts of methyl ethyl ketone, the mixture was neutralized with 2.36 parts of triethylamine, and while stirring, water was dripped. The prepolymer solution increased its viscosity slowly and when about 150 parts of water was dripped, the viscosity decreased abruptly, which indicated that the phase reversal was completed. After further addition of 150 parts of water, the resulting dispersion was heated to 30° C. and the organic solvent and excess water were removed under reduced pressure to obtain an aqueous dispersion of polyester fine particles having a dry solids ratio of 30.0% and an average particle diameter of 300 nm. The particle diameter was measured using MICROTRAC UPA-150, which is an ultrafine particle analyzer of single modular light scattering system.

Reference Example 3

Synthesis Example of Polyurethane Fine Particles

In a 1L four-necked flask equipped with a stirrer, a condenser, a dry nitrogen introduction pipe, and a thermometer were charged 533 parts of "BURNOCK DN-980" (trade name for polyisocyanate manufactured by Dainippon Ink and Chemicals, Inc'.), 33.5 parts of 2,2-bis(hydroxymethyl) propionic acid, 0.05 part of dibutyltin dilaurate, and 300 parts of ethyl acetate and stirred at 80° C. for 3 hours to obtain a solution of a polyurethane prepolymer having a dry solids ratio of 50.0%, and an NCO content of 6.80%. The NCO content was determined by weighing a predetermined amount of a sample solution, adding a fixed amount of an ethyl acetate solution of di-n-butylamine having a known concentration in an excess amount to an isocyanate group to be measured, and performing back titration of the excess di-n-butylamine using an aqueous hydrochloric acid solution having a known concentration.

To 100 parts of the above-described polyurethane prepolymer solution was added 30 parts of methyl ethyl ketone, the mixture was neutralized with 3.50 parts of triethylamine, and while stirring, water was dripped. The prepolymer solution increased its viscosity slowly and when about 150 parts of water was dripped, the viscosity decreased abruptly, which indicated that the phase reversal was completed. After further addition of 150 parts of water, a solution of 2.51 parts of diethylenetriamine in 50 parts of water was slowly added while stirring. Then, the resulting dispersion was heated to 30° C. and the organic solvent and excess water were removed under reduced pressure to obtain an aqueous dispersion of polyurethane fine particles having a dry solids ratio of 33.5% and an average particle diameter of 78 nm. The particle diameter was measured using MICROTRAC UPA-150, which is an ultrafine particle analyzer of single modular light scattering system. The acid value obtained by weighing a predetermined amount of a sample solution and titrating with a methanol solution of potassium hydroxide at a known concentration was 31.2.

Example 1

In a homogenizer (manufactured by Hitachi Ltd.) with a Cutter C20, 30.0 g of carbon black CWA (acrylate resin-grafted carbon black; carbon black content: 55% by weight; manufactured by Ciba-Geigy Limited), 45.0 g of distilled water, 60.0 g of isopropyl alcohol, and 15.0 g of ammoniac water (containing. 28 to 30% by weight as $NH_3$) were stirred and pulverized for 10 minutes and then filtered through a filter of 15 $\mu$m to obtain a dispersion of CWA. The dispersion contained 21.0% by weight of solids.

To 36.0 g of the aqueous dispersion of acrylic fine particles obtained in Reference Example 1 were added 30.0 g of carbon black CWA dispersion, 75.0 g of distilled water, 30.0 g of methanol and 0.02 g of MEGAFAC F-177 (manufactured by Dainippon Ink and Chemicals, Inc.) as a fluorine base surfactant, in that order, while stirring, and stirring was continued at room temperature for an additional 10 minutes to obtain a coating solution.

On a positive presensitized plate HP (manufactured by Polychrome Japan Co., Ltd.) which had been stripped of the matting agent in advance was coated the above-prepared coating solution using a wire bar rod number #9, which was dried at 50° C. for 3 minutes to obtain original plate 1 for a lithographic printing plate of the present invention. The coating weight was 1.3 g/m².

In an exposure machine TREND SETTER 3244F (manufactured by Creo Co., Ltd.) having mounted thereon an infrared semiconductor laser, exposed original plate 1 for a lithographic printing plate was image-wise and thereafter manually developed with a 1:25 dilute solution of a developer for posi-plate PD-1 (manufactured by Polychrome Japan Co., Ltd.) at 25° C. for 10 seconds to carry out a first development, followed by washing with water and drying. Then, exposure for 35 counts was carried out using a PS plate printer P-806-G (manufactured by Dai Nippon Screen Co., Ltd.). Next, using a second developer consisting of a 1:8 dilute solution of a developer for posi-plate PD-1 (manufactured by Polychrome Japan Co., Ltd.) and 0.5% by weight of benzyl alcohol, a second development processing was carried out at 30° C. for 12 seconds. On this occasion, the mask image was wholly peeled off simultaneously with the development. Further, after washing with water, treatment with a gum solution UGI (manufactured by Polychrome Japan Co., Ltd.) was carried out and dried to obtain a printing plate 1. The above-described operations were all done in a lit room.

Example 2

In a homogenizer (manufactured by Hitachi Ltd.) with a Cutter C20, 30.0 g of carbon black HCF for black color, 45.0 g of distilled water, 60.0 g of isopropyl alcohol, and 45.0 g of 10% aqueous solution of tetraethylammonium hydroxide were stirred and pulverized for 10 minutes and then filtered through a filter of 15 $\mu$m to obtain a dispersion of carbon black. The dispersion contained 22.2% by weight of solids.

To 40.0 g of the aqueous dispersion of polyester fine particles obtained in Reference Example 2 were added 35.0 g of carbon black dispersion, 240.0 g of distilled water, 100.0 g of a methanol solution containing 0.8% by weight of MEGAFAC F-470 (manufactured by Dainippon Ink and Chemicals, Inc.) as a fluorine base surfactant, in that order, while stirring, and stirring was continued at room temperature for an additional 10 minutes to obtain a coating solution.

On a positive presensitized plate HP (manufactured by Polychrome Japan Co., Ltd.) which had been stripped of the matting agent in advance was coated the above-prepared coating solution using a wire bar rod number #16, which was dried at 50° C. for 3 minutes to obtain original plate 2 for a lithographic printing plate of the present invention. The coating weight was 1.5 g/m².

In an exposure machine Trend Setter 3244F (manufactured by Creo Co., Ltd.) having mounted thereon an infrared semiconductor laser, original plate 2 for a lithographic printing plate was image-wise exposed and thereafter manually developed with a 1:25 dilute solution of a developer for posiplate PD-1 (manufactured by Polychrome Japan Co., Ltd.) at 25° C. for 10 seconds to carry out a first development, followed by washing with water and drying. Then, exposure for 35 counts was carried out using a PS plate printer P-806-G (manufactured by Dai Nippon Screen Co., Ltd.). Next, using a second developer consisting of a 1:8 dilute solution of a developer for posi-plate PD-1 (manufactured by Polychrome Japan Co., Ltd.) and 0.5% by weight of benzyl alcohol, a second development processing was carried out at 30° C. for 12 seconds. On this occasion, the mask image was wholly peeled off simultaneously with the development. Further, after washing with water, treatment with a gum solution UG1 (manufactured by Polychrome Japan Co., Ltd.) was carried out and dried to obtain a printing plate 2. The above-described operations were all done in a lit room.

Reference Example 4

Printing Plate Making from Positive PS Plate

Under a yellow safety light, contact printing was performed on a positive presensitized plate HP (manufactured by Polychrome Japan Co., Ltd.) for 35 counts in a P-806-G printer (manufactured by Dai Nippon Screen Co., Ltd.) using a film aving developed the same image as the image drawn by a Trend Setter and developed in an automated developer PD-912P (manufactured by Dai Nippon Screen Co., Ltd.) filled with a developer PD-1 (manufactured by Polychrome Japan Co., Ltd.) (1:8 dilution) and finishing gum PF2 (manufactured by Polychrome Japan Co., Ltd.) at 30° C. for 12 seconds, followed by drying to obtain a comparative printing plate 1.

Reference Example 5

Printing Test 1

The comparative printing plate 1 prepared according to conventional method, which was used as a standard, and the printing plates 1 and 2 of the present invention were attached on a press RZK (manufactured by Man Roland Co., limited), and a printing test for 50,000 sheets was conducted using the ink GEOS-G RED N (manufactured by Dainippon Ink and Chemicals, Inc.), dampening solution NA108W (manufactured by Dainippon Ink and Chemicals, Inc.) (1:50 dilution), and paper ROYAL COAT (manufactured by Oji Paper Co., Ltd.). The evaluation items of the print included thickening, thinning and adhesion of dots (2%, 50%, 98%), adhesion of microlines, water balance, tackyness, deposition of ink, print out, variation in print density, staining, etc. The prints 1 and 2 showed no problem of banding, etc. In each evaluation item, the evaluation results of the prints after printing 50,000 sheets were the same as those of the prints made by using the comparative printing plate 1 prepared by the conventional method used as a standard.

Example 3

To 40.0 g of the aqueous dispersion of acrylic polymer fine particles obtained in Reference Example 1 were added 35.0 g of the carbon black dispersion prepared in Example 2, 60.0 g of distilled water, 65.0 g of a methanol solution containing 1.25% by weight of MEGAFAC F-470 (manufactured by Dainippon Ink and Chemicals, Inc.) as a fluorine base surfactant, in that order, while stirring, and stirring was continued at room temperature for an additional 10 minutes to obtain a coating solution.

On a negative presensitized plate NN-2 (manufactured by Polychrome Japan Co., Ltd.) which had been stripped of the matting agent in advance was coated the above-prepared coating solution using a wire bar rod number #9, which coating solution was dried at 80° C. for 2 minutes to obtain original plate 4 for a lithographic printing plate of the present invention. The coating weight was 1.3 g/m².

In an exposure machine Trend Setter 3244F (manufactured by Creo Co., Ltd.) having mounted thereon an infrared semiconductor laser, the original plate 4 for a lithographic printing plate was image-wise exposed and thereafter manually developed with a 1:70 dilute solution of a developer for posi-plate PD-1 (manufactured by Polychrome Japan Co., Ltd.) at 25° C. for 10 seconds to carry out a first development, followed by washing with water and drying. Then, exposure for 35 counts was carried out using a PS plate printer P-806-G (manufactured by Dai Nippon Screen Co., Ltd.). Next, using a second developer consisting of a 1:3 dilute solution of a developer for nega-plate ND-1 (manufactured by Polychrome Japan Co., Ltd.), a second development processing was carried out at 30° C. for 19 seconds. On this occasion, the mask image was wholly peeled off during the development. Further, after washing with water, treatment with a gum solution UG1 (manufactured by Polychrome Japan Co., Ltd.) was carried out and dried to obtain a printing plate 4. The above-described operations were all done in a lit room.

Reference Example 6

Printing Plate Making from Negative PS Plate

Under a yellow safety light, contact printing was perfomed on a negative presensitized plate NN-2 (manufactured by Polychrome Japan Co., Ltd.) for 35 counts in a P-806-G printer (manufactured by Dai Nippon Screen Co., Ltd.) using a film having developed the same image as the image drawn by a Trend Setter and developed in an automated developer PD-912P (manufactured by Dai Nippon Screen Co., Ltd.) filled with a developer ND-1 (manufactured by Polychrome Japan Co., Ltd.) (1:3 dilution) and finishing gum NF2 (manufactured by Polychrome Japan Co., Ltd.) at 30° C. for 19 seconds, followed by drying to obtain a comparative printing plate 2.

Reference Example 7

Printing Test 2

The comparative printing plate 2 and the printing plates 3 and 4 of the present invention were attached on a press RZK (manufactured by man Roland Co., Ltd.), and a printing test for 50,000 sheets was conducted using the ink GEOS-G RED N (manufactured by Dainippon Ink and Chemicals, Inc.), dampening solution NA108W (manufactured by Dainippon Ink and Chemicals, Inc.) (1:50 dilution), and paper ROYAL COAT (manufactured by Oji Paper Co., Ltd.). The evaluation items of the print included thickening, thinning and adhesion of dots (2%, 50%, 98%), adhesion of microline, water balance, tackyness, deposition of ink, print out, variation in print density, staining, etc. The prints 3 and 4 showed no problem of banding, etc. In each evaluation item, the evaluation results of the prints after printing 50,000 sheets were the same as those of the prints made by using the comparative printing plate 2 prepared by the conventional method used as a standard.

What is claimed is:

1. A heat-sensitive composition comprising a substance which absorbs light and generates heat, an anionic self water-dispersible resin particle having an acid value of 10 to 300 and a number average molecular weight within the range of 3,000 to 50,000, and a fluorine base surfactant, wherein said anionic self water-dispersible resin particles are fine particles produced by a process including a first step in which an anionic self water-dispersible resin is dissolved or dispersed in an organic solvent and a second step in which the dissolved or dispersed composition is phase reverse-emulsified to generate fine particles in an aqueous medium.

2. The heat-sensitive composition as claimed in claim 1, wherein said anionic self water-dispersible resin particle has a number average molecular weight within the range of 5,000 to 50,000.

3. The heat-sensitive composition as claimed in claim 1, wherein said substance which absorbs light and generates heat is a graft-polymerized pigment.

4. The heat-sensitive composition as claimed in claim 3, wherein said graft-polymerized pigment is carbon black.

5. The heat-sensitive composition as claimed in claim 1, wherein the second step is followed by a third step in which the organic solvent and excess water are removed.

6. The heat-sensitive composition as claimed in claim 5, wherein the second step further includes a step of deneutralizing acid group after the reverse phase emulsification.

7. The heat-sensitive composition as claimed in claim 1, wherein said anionic self water-dispersible resin particle comprises as essential components a copolymer obtained by using an acid group-containing polymerizable monomer and/or an acid group-containing polymerizable oligomer having at least one acid group selected from the group consisting of a carboxylic group, a sulfonic group, and a sulfuric group.

* * * * *